US012787312B2

(12) United States Patent
Zheng et al.

(10) Patent No.: US 12,787,312 B2
(45) Date of Patent: Nov. 3, 2026

(54) METHOD FOR MANUFACTURING CAPACITOR STRUCTURE

(71) Applicants: TAIWAN SEMICONDUCTOR MANUFACTURING COMPANY, LTD., Hsinchu (TW); TSMC CHINA COMPANY LIMITED, Shanghai (CN)

(72) Inventors: Qinghui Zheng, Shanghai City (CN); Yonghao Fu, Shanghai City (CN); Yuzhe Lin, Shanghai City (CN)

(73) Assignees: TAIWAN SEMICONDUCTOR MANUFACTURING COMPANY, LTD., Hsinchu (TW); TSMC CHINA COMPANY LIMITED, Shanghai (CN)

( * ) Notice: Subject to any disclaimer, the term of this patent is extended or adjusted under 35 U.S.C. 154(b) by 588 days.

(21) Appl. No.: 18/327,536

(22) Filed: Jun. 1, 2023

(65) Prior Publication Data

US 2024/0387606 A1 Nov. 21, 2024

(30) Foreign Application Priority Data

May 16, 2023 (CN) ......................... 202310551528.7

(51) Int. Cl.
*H10D 1/68* (2025.01)
*C23C 16/505* (2006.01)
(Continued)

(52) U.S. Cl.
CPC ............. *H10D 1/68* (2025.01); *C23C 16/505* (2013.01); *H01J 37/32082* (2013.01);
(Continued)

(58) Field of Classification Search
CPC .................... H01J 2237/182; H01J 2237/3321
See application file for complete search history.

(56) References Cited

U.S. PATENT DOCUMENTS

2005/0218116 A1* 10/2005 Chou ................ H01L 21/67069 156/345.48
2007/0054504 A1* 3/2007 Chen .................. H01L 21/3105 257/E21.279
(Continued)

FOREIGN PATENT DOCUMENTS

| | | | |
|---|---|---|---|
| TW | 201419382 | A | 5/2014 |
| TW | 202114156 | A | 4/2021 |

OTHER PUBLICATIONS

IP.com Search History (Year: 2026).*

*Primary Examiner* — Zandra V Smith
*Assistant Examiner* — Andre C Stevenson
(74) *Attorney, Agent, or Firm* — Maschoff Brennan

(57) ABSTRACT

A method includes forming a bottom electrode of a capacitor over a substrate; depositing an isolation dielectric layer of the capacitor over the bottom electrode; and forming a top electrode of the capacitor over the isolation dielectric layer. Depositing the isolation dielectric layer includes heating the substrate to a predetermined temperature range; depositing a first sub-layer of the isolation dielectric layer at the predetermined temperature range; cooling down the substrate and the first sub-layer; heating the substrate and the first sub-layer to the predetermined temperature range; and depositing a second sub-layer of the isolation dielectric layer on the first sub-layer at the predetermined temperature range. Cooling down the substrate and the first sub-layer and heating the substrate and the first sub-layer are performed under an vacuum condition without vacuum break therebetween.

20 Claims, 10 Drawing Sheets

(51) Int. Cl.

| | |
|---|---|
| ***H01J 37/32*** | (2006.01) |
| ***H10P 14/60*** | (2026.01) |
| ***H10W 20/40*** | (2026.01) |

(52) U.S. Cl.

CPC .... *H01J 37/32816* (2013.01); *H10P 14/6336* (2026.01); *H10W 20/496* (2026.01); *H01J 2237/182* (2013.01); *H01J 2237/3321* (2013.01)

(56) References Cited

U.S. PATENT DOCUMENTS

| | | | | |
|---|---|---|---|---|
| 2014/0012073 | A1 | 1/2014 | Ellering | |
| 2014/0120737 | A1 | 5/2014 | Swaminathan et al. | |
| 2015/0235835 | A1 * | 8/2015 | Swaminathan | C23C 16/045<br>438/778 |
| 2019/0014017 | A1 | 1/2019 | Paul et al. | |
| 2019/0140171 | A1 | 5/2019 | BrightSky et al. | |
| 2021/0375589 | A1 * | 12/2021 | Kagaya | H01J 37/32174 |
| 2022/0084795 | A1 * | 3/2022 | Collins | H01J 37/32449 |
| 2023/0295797 | A1 * | 9/2023 | Matsuki | C23C 16/4554<br>427/579 |

* cited by examiner

300

METHOD FOR MANUFACTURING CAPACITOR STRUCTURE

PRIORITY CLAIM AND CROSS-REFERENCE

The present application claims priority to China Application Serial Number 202310551528.7, filed May 16, 2023, which is herein incorporated by reference.

BACKGROUND

The semiconductor integrated circuit (IC) industry has experienced rapid growth. In the course of the IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as the semiconductor industry has progressed into nanometer technology process nodes in pursuit of higher device density, higher performance, and lower costs, challenges from both fabrication and design have resulted in the development of three-dimensional (3D) devices. Along with the development of 3D devices, there is a need for capacitors for the 3D devices. Accordingly, although existing capacitors and methods of fabricating capacitors have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
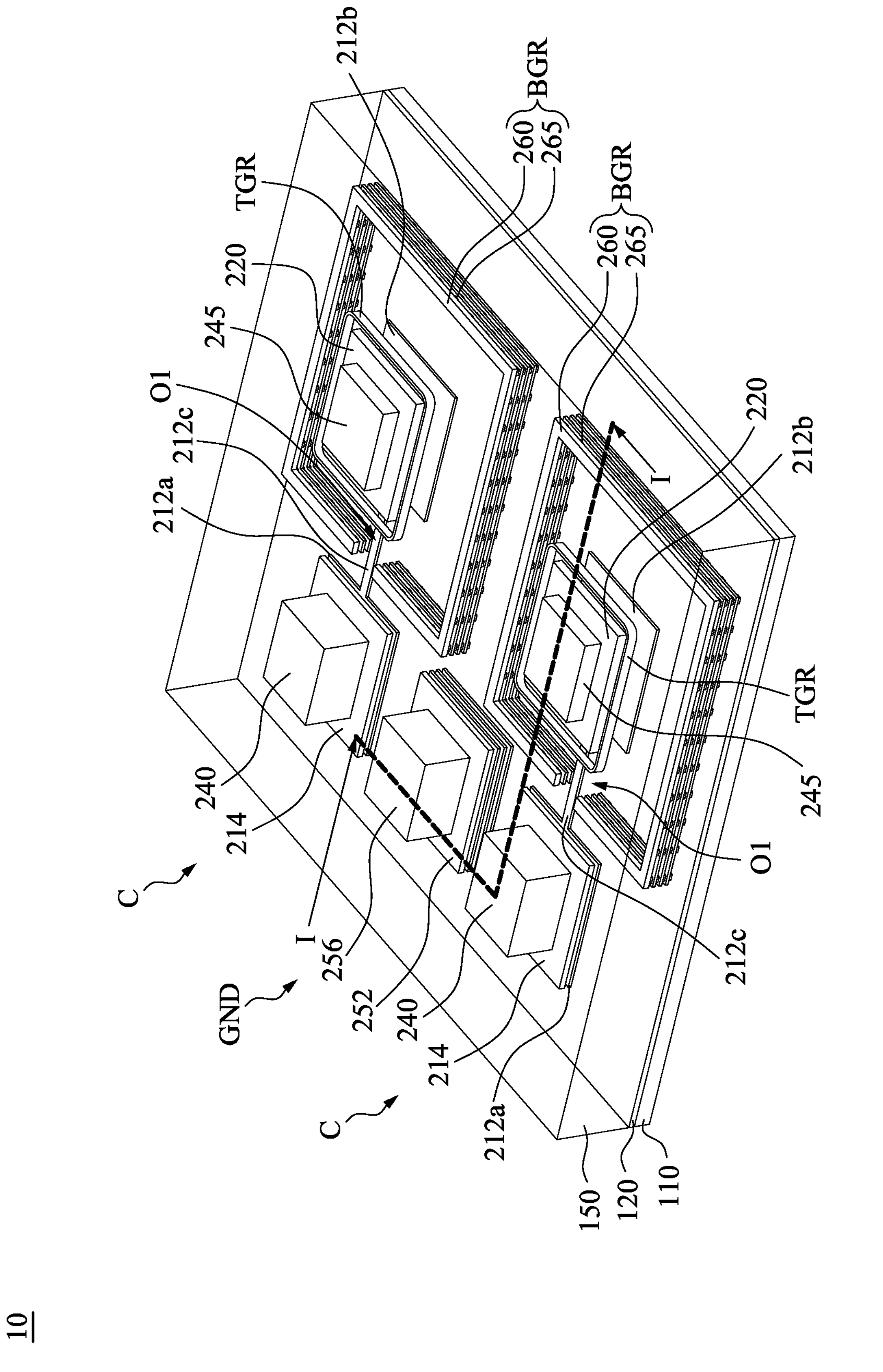
FIG. 1 is a perspective view of a capacitor structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath”, “below”, “lower”, “above”, “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, “around”, “about”, “approximately”, or “substantially” shall generally mean within 20 percent, or within 10 percent, or within 5 percent of a given value or range. Numerical quantities given herein are approximate, meaning that the term “around”, “about”, “approximately”, or “substantially” can be inferred if not expressly stated. One of ordinary skill in the art will appreciate that the dimensions may be varied according to different technology nodes. One of ordinary skill in the art will recognize that the dimensions depend upon the specific device type, technology generation, minimum feature size, and the like. It is intended, therefore, that the term be interpreted in light of the technology being evaluated.

The present disclosure is related to capacitor structures and methods of forming the same. More particularly, some embodiments of the present disclosure are related to capacitor structures including an ultra-thick insulator layer with improved quality to sustain operation under a high voltage level. The breakdown voltage (BV) of the capacitor can be improved, for example, about 5% increase.

Figure 2:
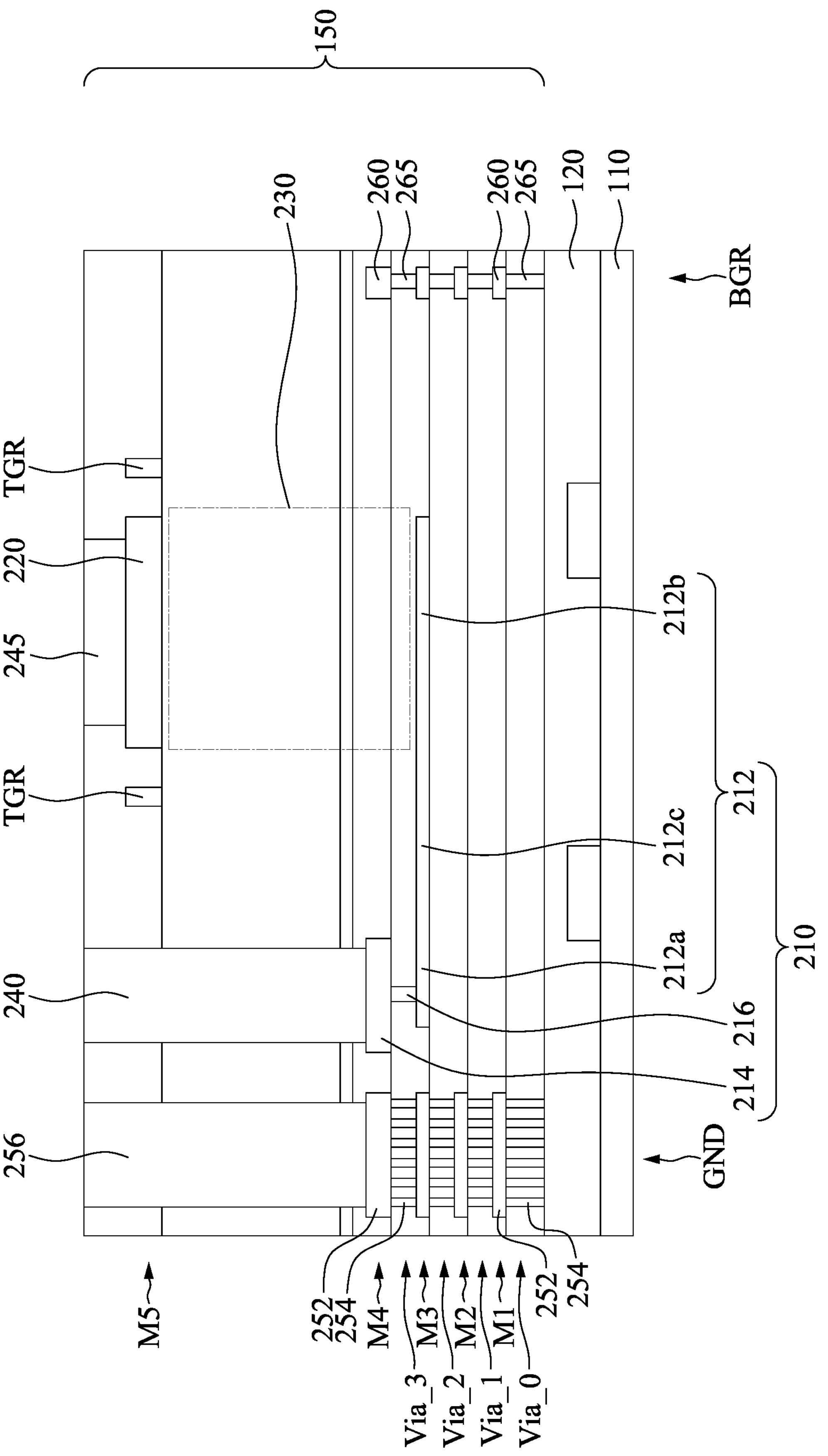
FIG. 2 is a cross-sectional view taken along line I-I in FIG. 1.

FIG. 1 is a perspective view of a capacitor structure 10 in accordance with some embodiments, and FIG. 2 is a cross-sectional view taken along line I-I in FIG. 1. The capacitor structure 10 includes a substrate 110 and capacitors C. The capacitors C are formed over the substrate 110. For example, an interconnection structure 150 is formed over the substrate 110, and the capacitors C are formed in the interconnection structure 150. The capacitor structure 10 may be introduced for digital isolated couplers which enable products to provide isolation voltage greater than about 7500 Vrms (volts root mean square) at about 10 kV peak and greater than about 12000 V surge capability.

The capacitor C includes a bottom electrode 210, a top electrode 220, and an isolation layer 230 between the bottom electrode 210 and the top electrode 220. In some embodiments, at least one or multiple sub-layers of the isolation layer 230 is/are formed by using the manufacturing method discussed below, such that the quality of the isolation layer 230 can be improved to provide high breakdown voltage between the bottom electrode 210 and the top electrode 220.

In some embodiments, the bottom electrode 210 includes a bottom conductive layer 212, a top conductive layer 214, and at least one via 216. The bottom conductive layer 212 has a landing portion 212*a*, a capacitor portion 212*b*, and a connecting portion 212*c*. The connecting portion 212*c* interconnects the landing portion 212*a* and the capacitor portion 212*b*. Therefore, the bottom conductive layer 212 can be a single piece of continuous material. The top conductive layer 214 is formed directly over the landing portion 212*a*, and the via 216 is connected to the top conductive layer 214 and the landing portion 212*a*. As such, the top conductive layer 214 is electrically connected to the bottom conductive layer 212. In some embodiments, the top conductive layer 214, the landing portion 212*a*, and the capacitor portion 212*b* have rectangular shapes in a top view, and the connecting portion 212*c* has a bar shape in the top view. However, the shapes of the landing portion 212*a*, the capacitor portion 212*b*, and the connecting portion 212*c* in FIG. 1 are only examples and should not limit the scope of this disclosure.

The top electrode 220 is directly over the capacitor portion 212*b*, and the isolation layer 230 is directly between the top electrode 220 and the capacitor portion 212*b*. As such, the capacitance of the capacitor C is determined by the structures of the top electrode 220, the capacitor portion 212*b*, and the isolation layer 230 therebetween.

In some embodiments, each of the capacitors C further includes a bottom metal pad 240 and a top metal pad 245. The bottom metal pad 240 is formed over the top conductive layer 214, such that the bottom metal pad 240 is electrically connected to the bottom electrode 210. The top metal pad 245 is formed over the top electrode 220, such that the top metal pad 245 is electrically connected to top electrode 220.

In some embodiments, the capacitor structure 10 further includes bottom guard rings BGR surrounding the capacitor portions 212*b* of the bottom conductive layer 212, respectively. The bottom guard rings BGR are configured to isolate noise between the adjacent capacitor portions 212*b* of the bottom conductive layer 212. Each of the bottom guard rings BGR has an opening O1, and the connecting portion 212*c* extends from the capacitor portion 212*b*, passes through the opening O1 of the bottom guard rings BGR, to the landing portion 212*a*.

Each of the bottom guard rings BGR includes multiple layers of conductive lines 260 and vias 265 between the adjacent conductive lines 260. The bottom guard rings BGR may be connected to a device layer 120, which is formed between the substrate 110 and the interconnection structure 150, of the capacitor structure 10.

In some embodiments, the capacitor structure 10 further includes top guard rings TGR surrounding the top electrodes 220, respectively. The top guard rings TGR are configured to isolate noise between the adjacent top electrodes 220.

In some embodiments, the capacitor structure 10 further includes a ground structure GND over the substrate 110. The ground structure GND may be disposed between the landing portions 212*a*. The ground structure GND includes conductive layers 252, vias 254, and a ground pad 256. The conductive layers 252 are vertically stacked. The vias 254 are disposed between the adjacent conductive layers 252. The ground pad 256 is disposed over the topmost conductive layer 252.

As shown in FIG. 2, the interconnection structure 150 includes via levels Via_0 level, Via_1 level, Via_2 level, and Via_3 level, and metal layer levels M1 level, M2 level, M3 level, M4 level, and M5 level. The bottom conductive layer 212 is at the M3 level, the top conductive layer 214 is at the M4 level, the top electrode 220 and the top guard rings TGR are at the M5 level, and the via 216 is at the Via_3 level. The conductive lines 260 of the bottom guard rings BGR are at the M1 level to M4 level, and the vias 265 of the bottom guard rings BGR are at the Via_0 level to Via_3 level. The conductive layers 252 of the ground structure GND are at the M1 level to M4 level, and the vias 254 of the bottom guard rings BGR are at the Via_0 level to Via_3 level.

Figure 3A:
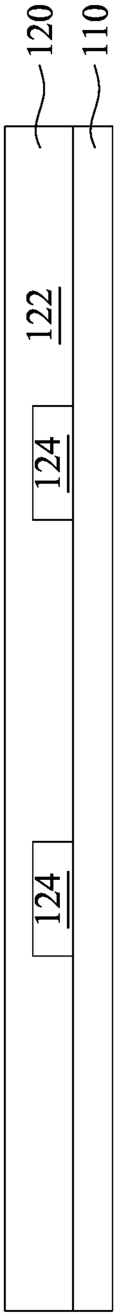
FIGS. 3A-3G illustrate cross-sectional views of intermediate stages in the formation of the capacitor structure in accordance with some embodiments of the present disclosure.

FIGS. 3A-3G illustrate cross-sectional views of intermediate stages in the formation of the capacitor structure 10 in accordance with some embodiments of the present disclosure. Referring to FIG. 3A, a substrate 110 is provided. The substrate 110 may be made of silicon or other semiconductor materials. Alternatively or additionally, the substrate 110 includes other elementary semiconductor materials such as germanium. In some embodiments, the substrate 110 is made of a compound semiconductor such as silicon carbide, gallium arsenic, indium arsenide, or indium phosphide. In some embodiments, the substrate 110 is made of an alloy semiconductor such as silicon germanium, silicon germanium carbide, gallium arsenic phosphide, or gallium indium phosphide. In some embodiments, the substrate 110 includes an epitaxial layer. For example, the substrate 110 has an epitaxial layer overlying a bulk semiconductor.

The substrate 110 may include various doped regions such as p-type wells or n-type wells). Doped regions may be doped with p-type dopants, such as boron or $BF_2$, and/or n-type dopants, such as phosphorus (P) or arsenic (As). The doped regions may be formed directly on the substrate 110, in a P-well structure, in an N-well structure, or in a dual-well structure. Isolation features, such as shallow trench isolation (STI) features or local oxidation of silicon (LOCOS) features, may be formed in the substrate 110. Isolation features may define and isolate various device elements 124 described below.

A device layer 120 is formed over the substrate 110. In some embodiments, the device layer 120 includes an inter-layer dielectric (ILD) layer 122. The ILD layer 122 may be formed by chemical vapor deposition (CVD), high-density plasma CVD, spin-on, sputtering, or other suitable methods. In some embodiments, the ILD layer 122 includes silicon oxide. In some other embodiments, the ILD layer 122 may include silicon oxy-nitride, silicon nitride, SiOCN, compounds including Si, O, C and/or H (e.g., silicon oxide, SiCOH and SiOC), a low-k material, or organic materials (e.g., polymers).

Device elements 124 are formed in the ILD layer 122. The device elements 124 include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.), diodes, and/or other applicable elements. Various processes are performed to form the device elements 124, such as deposition, etching, implantation, photolithography, annealing, and/or other applicable processes. In some embodiments, the device elements 124 are formed on and/or in the substrate 110 in a front-end-of-line (FEOL) process.

Figure 3B:
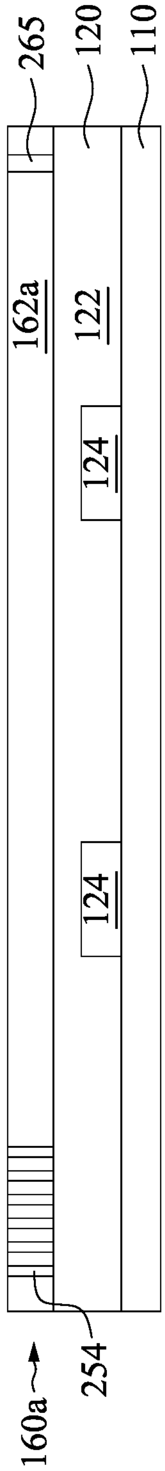

Referring to FIG. 3B, the interconnection structure 150 (see FIG. 2) is formed over the device layer 120. Specifically, a first metallization layer 160*a* is formed over the device layer 120. The first metallization layer 160*a* includes an inter-metal dielectric (IMD) layer 162*a* and vertical interconnects, such as conductive vias 254 and 265, respectively extending vertically in the first IMD layer 162*a*.

For example, the IMD layer 162*a* is formed over the device layer 120, and openings are formed in the IMD layer 162*a*. Conductive material is filled in the openings to form the conductive vias 254 and 265. The conductive vias 254 and 265 can be formed using, for example, a single damascene process, a dual damascene process, the like, or combinations thereof. In some embodiments, the IMD layer 162*a* may include low-k dielectric materials having k values, for example, lower than about 4.0 or even 2.0 disposed between such conductive features. In some embodiments, the IMD layer 162*a* may be made of, for example, phosphosilicate glass (PSG), borophosphosilicate glass (BPSG), fluorosilicate glass (FSG), SiOxCy, Spin-On-Glass, Spin-On-Polymers, silicon oxide, silicon oxynitride, combinations thereof, or the like, formed by any suitable method, such as spin-on coating, chemical vapor deposition (CVD), plasma-enhanced CVD (PECVD), or the like. The conductive vias 254 and 265 may include metal materials such as copper, aluminum, tungsten, combinations thereof, or the like. In some embodiments, the conductive vias 254 and 265 may further include one or more barrier/adhesion layers (not shown) to protect the respective conductive vias 254 and 265 from metal diffusion (e.g., copper diffusion) and metallic poisoning. The one or more barrier/adhesion layers may include titanium, titanium nitride, tantalum, tantalum nitride, or the like, and may be formed using physical vapor deposition (PVD), CVD, ALD, or the like.

Figure 3C:
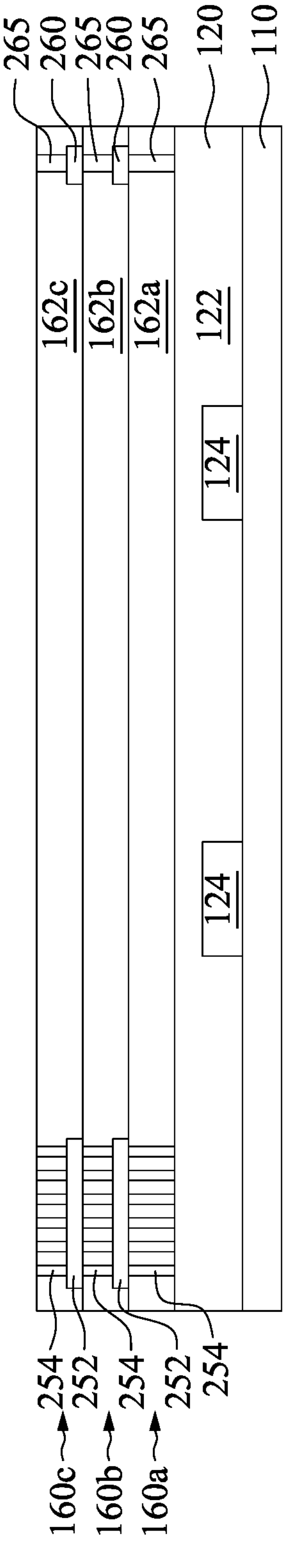

Referring to FIG. 3C, a second metallization layer 160*b* is formed over the first metallization layer 160*a*. The second metallization layer 160*b* includes an IMD layer 162*b*, one or more horizontal interconnects, such as the conductive layers 252 and the conductive lines 260, respectively extending horizontally or laterally in the IMD layer 162*b* and vertical interconnects, such as conductive vias 254 and 265, respectively extending vertically in the IMD layer 162*b*.

For example, a conductive layer is formed over the first metallization layer 160*a*, and the conductive layer is patterned to be the conductive layers 252 and the conductive lines 260. Materials, configurations, and/or dimensions regarding the conductive layers 252 and the conductive lines 260 are similar to or the same as the conductive vias 254 and 265 described above.

The IMD layer 162*b* is then deposited over the first metallization layer 160*a* to cover the conductive layers 252 and the conductive lines 260. Materials, configurations, dimensions, processes and/or operations regarding the IMD layer 162*b* are similar to or the same as the IMD layer 162*a* described above. Subsequently, conductive vias 254 and 265 are formed in the IMD layer 162*b*. Materials, configurations, dimensions, processes and/or operations regarding the conductive vias 254 and 265 in the IMD layer 162*b* are similar to or the same as the conductive vias 254 and 265 in the IMD layer 162*a* described above.

A third metallization layer 160*c* is then formed over the second metallization layer 160*b*. The third metallization layer 160*c* includes an IMD layer 162*c*, one or more horizontal interconnects, such as the conductive layers 252 and the conductive lines 260, respectively extending horizontally or laterally in the IMD layer 162*c* and vertical interconnects, such as conductive vias 254 and 265, respectively extending vertically in the IMD layer 162*c*. Materials, configurations, dimensions, processes and/or operations regarding the conductive layers 252 and the conductive lines 260 in the IMD layer 162*c* are similar to or the same as the conductive layers 252 and the conductive lines 260 in the IMD layer 162*b* described above. Materials, configurations, dimensions, processes and/or operations regarding the IMD layer 162*c* are similar to or the same as the IMD layer 162*a* described above. Materials, configurations, dimensions, processes and/or operations regarding the conductive vias 254 and 265 in the IMD layer 162*c* are similar to or the same as the conductive vias 254 and 265 in the IMD layer 162*a* described above.

Figure 3D:
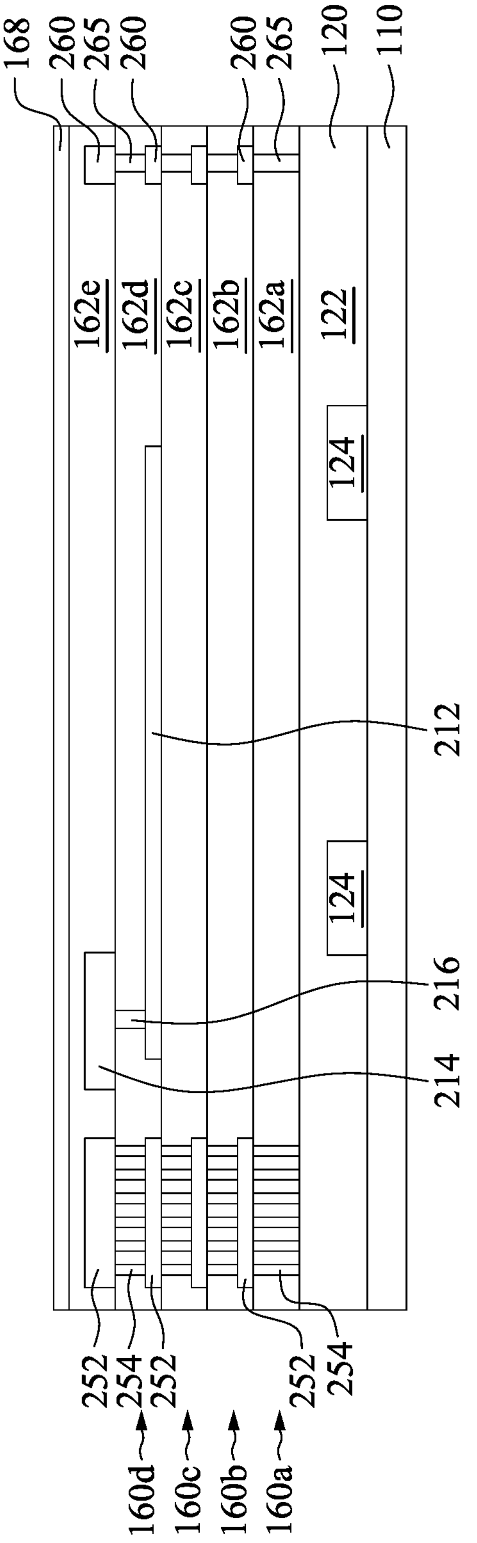

Referring to FIG. 3D, a fourth metallization layer 160*d* is formed over the third metallization layer 160*c*. The fourth metallization layer 160*d* includes an IMD layer 162*d*, one or more horizontal interconnects, such as the conductive layers 252, the conductive lines 260, and the bottom conductive layer 212, respectively extending horizontally or laterally in the IMD layer 162*d* and vertical interconnects, such as conductive vias 254, 265, and 216, respectively extending vertically in the IMD layer 162*d*. Materials, configurations, dimensions, processes and/or operations regarding the conductive layers 252, the conductive lines 260, and the bottom conductive layer 212 in the IMD layer 162*d* are similar to or the same as the conductive layers 252 and the conductive lines 260 in the IMD layer 162*b* described above. Materials, configurations, dimensions, processes and/or operations regarding the IMD layer 162*d* are similar to or the same as the IMD layer 162*a* described above. Materials, configurations, dimensions, processes and/or operations regarding the conductive vias 254, 265, and 216 in the IMD layer 162*d* are similar to or the same as the conductive vias 254 and 265 in the IMD layer 162*a* described above.

Subsequently, a fifth metallization layer 160*e* (see FIG. 3F) is formed over the fourth metallization layer 160*d*. Specifically, a conductive layer is formed over the fourth metallization layer 160*d*, and the conductive layer is patterned to form the conductive layers 252, the conductive lines 260, and the top conductive layer 214. Materials, configurations, dimensions, processes and/or operations regarding the conductive layers 252, the conductive lines 260, and the top conductive layer 214 are similar to or the same as the conductive layers 252 and the conductive lines 260 in the IMD layer 162*b* described above.

Subsequently, an IMD layer 162*e* is formed over the fourth metallization layer 160*d* and covers the conductive layers 252, the conductive lines 260, and the top conductive layer 214. Materials, configurations, dimensions, processes and/or operations regarding the IMD layer 162*e* are similar to or the same as the IMD layer 162*a* described above. A protection layer 168 is then deposited over the IMD layer 162*e*. In some embodiments, the protection layer 168 may be silicon nitride (SiN), silicon carbonoxide (SiCO), silicon carbonnitride (SiCN), silicon oxycarbonnitride (SiOCN), or the like. The protection layer 168 is formed using a deposition technique that can form conformal dielectric layers, such as thermal atomic layer deposition (ALD), plasma-enhanced (PE) ALD, pulsed PEALD, or atomic layer chemical vapor deposition (AL-CVD). In some embodiments, the protection layer 168 has a thickness smaller than a thickness of the IMD layer 162*e*, and the thickness of the protection layer 168 is in a range from about 540 nm to about 660 nm.

An isolation dielectric layer 169 (see FIG. 3F) is then deposited over the protection layer 168. The isolation dielectric layer 169 is an ultra thick layer, which provides a high isolation voltage between the top electrode 220 and the bottom electrode 210 of the capacitor C (see FIG. 1). Specifically, the breakdown voltage of the capacitor C is determined by the quality of the isolation dielectric layer 169. That is, the isolation dielectric layer 169 with high quality provides a high breakdown voltage (e.g., about 720 V/um to about 880 V/um). Therefore, some embodiments of this disclosure provide some manufacturing methods to form high quality isolation dielectric layers 169.

Figure 4:
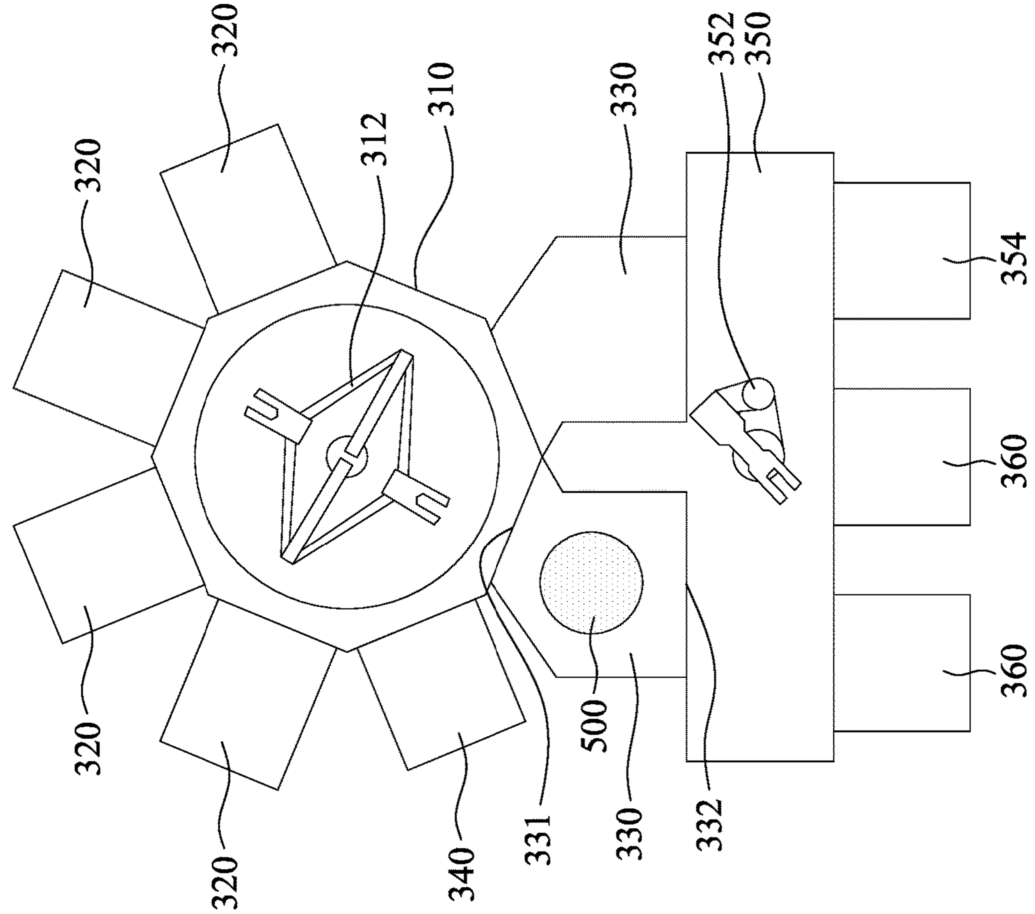
FIG. 4 is a schematic plan view of a wafer processing system in accordance with some embodiments of the present disclosure.

FIG. 4 is a schematic plan view of a wafer processing system 300 in accordance with some embodiments of the present disclosure. The wafer processing system 300 includes a polyhedral transfer chamber 310, a plurality of deposition apparatuses 320, load lock chambers 330, and a cooling chamber 340. For example, in FIG. 4, the wafer processing system 300 includes the polyhedral transfer chamber 310, four of the deposition apparatuses 320, two load lock chambers 330, and the cooling chamber 340. The polyhedral transfer chamber 310 includes a central transfer mechanism 312 which performs the physical transfer of wafers 500. The polyhedral transfer chamber 310 is connected to the deposition apparatuses 320, the cooling chamber 340, and the load lock chambers 330. This configuration allows the central transfer mechanism 312 to transport the wafers 500 among the deposition apparatuses 320, the cooling chamber 340, and the load lock chambers 330.

The deposition apparatuses 320 may be physical vapor deposition (PVD) apparatuses, chemical vapor deposition (CVD) apparatuses, plasma-enhanced chemical vapor deposition (PECVD) apparatuses, electrochemical deposition (ECD) apparatuses, molecular beam epitaxy (MBE) apparatuses, atomic layer deposition (ALD) apparatuses and/or other deposition apparatuses. The cooling chamber 340 is configured to lower the temperature of the wafers 500. The wafers 500 can be cooled down in the cooling chamber 340.

The sealed design of the wafer processing system 300 protects the wafers 500 from outside contaminants. The area of the wafer processing system 300 defined by the polyhedral transfer chamber 310, the deposition apparatuses 320, and the cooling chamber 340 is sealed. Atmospheric controls, including filtering, provide an environment with extremely low levels of particulates and airborne molecular contamination (AMC), both of which may damage the wafers 500. By creating a microenvironment within the wafer processing system 300, the deposition apparatuses 320 can be operated in a cleaner environment than the surrounding facilities. This allows tighter control of contaminates during wafer processing at reduced cost.

The wafer processing system 300 further includes an equipment front end module (EFEM) 350. The load lock chambers 330 preserve the atmosphere within the polyhedral transfer chamber 310, the deposition apparatuses 320, and the cooling chamber 340 by separating them from the EFEM 350. That is, the polyhedral transfer chamber 310 is connected to the EFEM 350 through the load lock chambers 330. Each of the load lock chambers 330 includes two doors, a polyhedral transfer chamber door 331 and a load lock door 332. The wafers 500 are inserted into the load lock chamber 330 and both doors are sealed. The load lock chambers 330 are capable of creating an atmosphere compatible with the EFEM 350 or the polyhedral transfer chamber 310 depending on where the loaded wafers 500 are scheduled to be next. This may alter the gas content of the load lock chambers 330 by such mechanisms as adding purified gases or creating a vacuum, along with other suitable means for adjusting the load lock chamber atmosphere. When the correct atmosphere has been reached, the corresponding door may be opened, and the wafers 500 can be accessed.

The EFEM 350 provides a closed environment in which to transfer the wafers 500 into and out of the wafer processing system 300. The EFEM 350 includes a load lock mechanism 352 which performs the physical transfer of the wafers 500. The wafers 500 are loaded through a load port 354. In FIG. 4, the wafers 500 arrive at the load port 354 contained in a transport carrier 360 such as a front-opening unified pod ("FOUP"), a front-opening shipping box ("FOSB"), a standard mechanical interface ("SMIF") pod, and/or other suitable container. The transport carrier 360 is a magazine for holding one or more wafers 500 and for transporting the wafers 500 between manufacturing tools. In some embodiments, the transport carrier 360 may have features such as coupling locations and electronic tags to facilitate use with an automated materials handling system.

Figure 5:
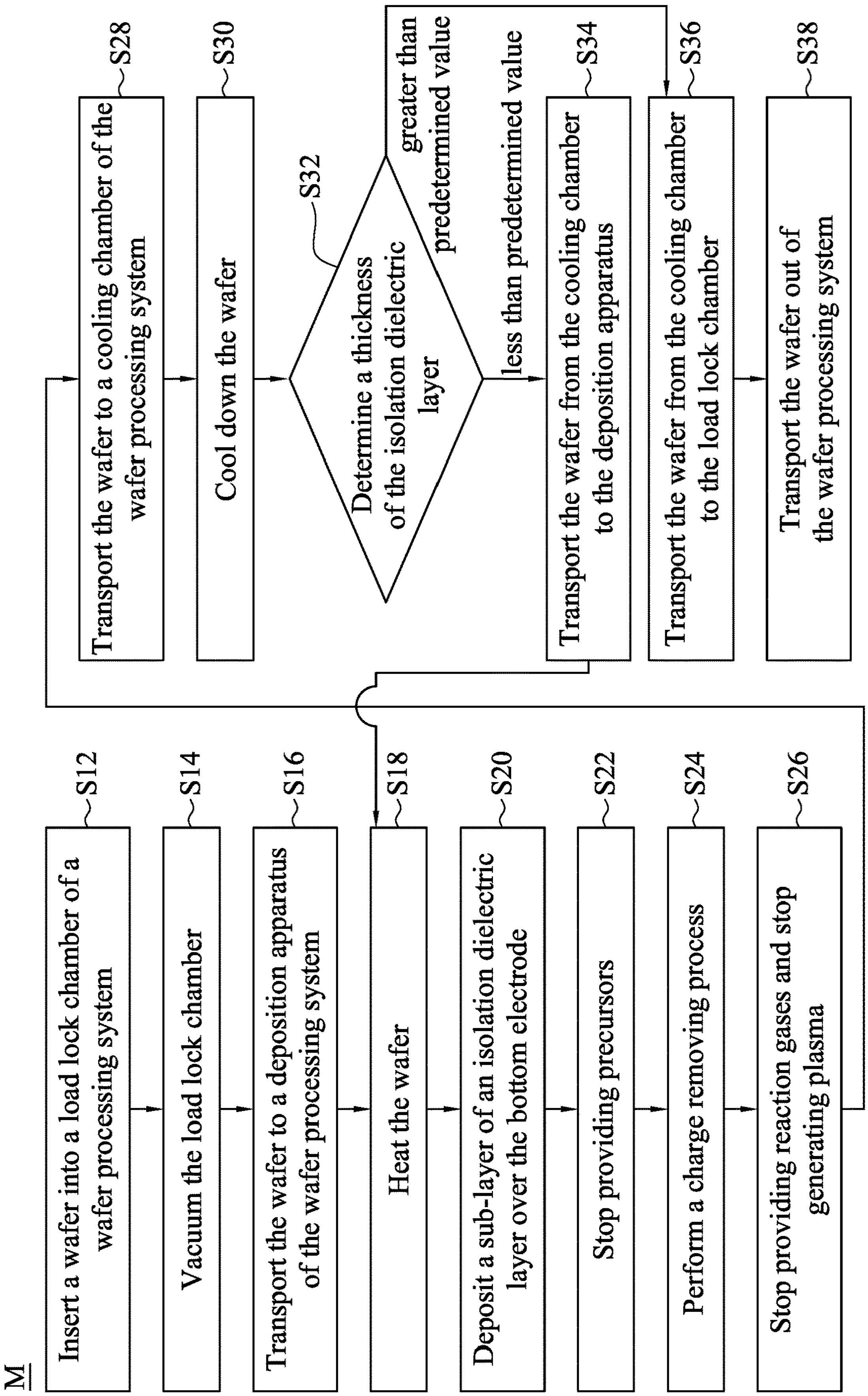
FIG. 5 is a flowchart illustrating a method for depositing the isolation dielectric layer in accordance with some embodiments of the present disclosure.

FIG. 5 is a flowchart illustrating a method M for depositing the isolation dielectric layer in accordance with some embodiments of the present disclosure. Various operations of the method M are discussed in association with at least FIGS. 1-8. For illustration purposes, the wafer processing system 300 mentioned above is referenced to collectively describe the details of the method M. It is noted that each of the methods presented below is merely an example, and not intended to limit the present disclosure beyond what is explicitly recited in the claims. Additional operations may be provided before, during, and after each of the methods. Some operations described may be replaced, eliminated, or moved around for additional embodiments of the transport methods. Additionally, for clarity and ease of explanation, some elements of the figures have been simplified.

The operation S12 of method M includes inserting a wafer into a load lock chamber of a wafer processing system. For example, in FIG. 4, the wafers 500, which have structures illustrated in FIG. 3D, are stored in the transport carrier 360 and are transported to the wafer processing system 300. The wafers 500 are then taken out of the transport carrier 360 and inserted into at least one of the load lock chambers 330 by using the load lock mechanism 352.

The operation S14 of method M includes vacuuming the load lock chamber. For example, as shown in FIG. 4, after the wafers 500 are inserted into the load lock chamber 330, the load lock door(s) 332 is (are) closed, and the load lock chamber(s) 330 with the wafers 500 is (are) sealed. A vacuum process is then performed to the load lock chamber (s) 330, such that the wafers 500 in the load lock chamber(s) 330 are under a vacuum condition. In some embodiments, the vacuum condition is an environment having a pressure under about 0.1 torr.

The operation S16 of method M includes transporting the wafer to a deposition apparatus of the wafer processing system. In FIG. 4, after the load lock chamber(s) 330 containing the wafers 500 is (are) under the vacuum condition, the load lock door(s) 332 is (are) open, and the wafers 500 are transported to the deposition apparatuses 320 one by one by using the central transfer mechanism 312.

Figure 6:
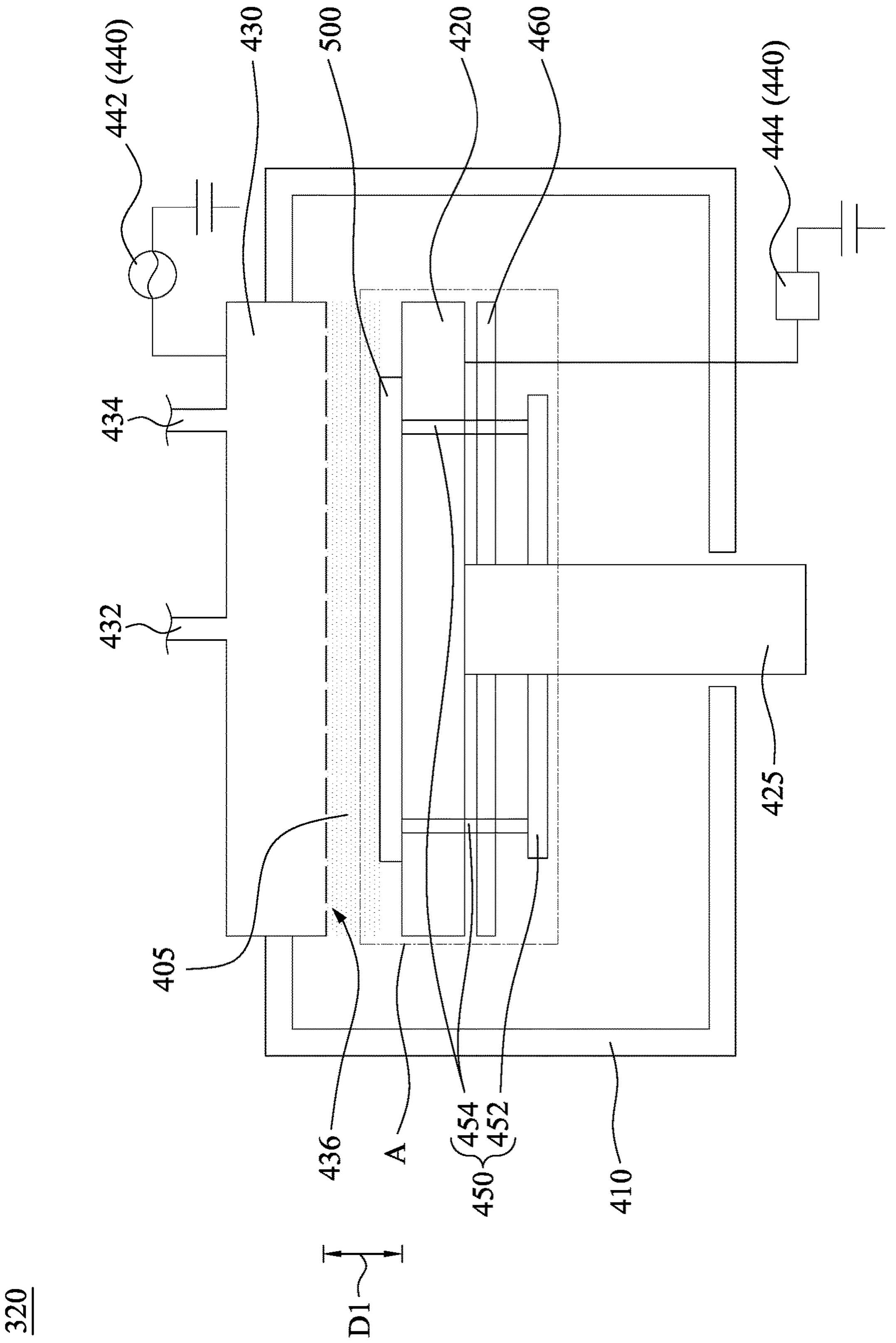
FIG. 6 is a schematic diagram of the deposition apparatus in accordance with some embodiments.

FIG. 6 is a schematic diagram of the deposition apparatus 320 in accordance with some embodiments. The deposition apparatus 320 may be a plasma enhanced chemical vapor deposition apparatus. The deposition apparatus 320 includes a deposition chamber 410, a susceptor 420, a showerhead 430, a plasma generator 440, and a lifting mechanism 450. The susceptor 420, which is supported by a spindle 425, is disposed in the deposition chamber 410 to support the wafer 500. The showerhead 430 is disposed in the deposition chamber 410 and above the susceptor 420 to provide precursors into the deposition chamber 410.

The lifting mechanism 450 is coupled to the susceptor 420 to lift the wafer 500 from the susceptor 420. The lifting mechanism 450 includes a frame 452 and a plurality of pins 454 protruding from the frame 452. When the frame 452 moves upward, the pins 454 pass through the susceptor 420 and protrude from the top surface of the susceptor 420. Therefore, when the central transfer mechanism 312 transports the wafer 500 into the deposition chamber 410, the central transfer mechanism 312 puts the wafer 500 onto the pins 454, such that the wafer 500 is suspended above the susceptor 420. The central transfer mechanism 312 is then withdrawn, and the frame 452 of the lifting mechanism 450 moves downward, such that the wafer 500 is disposed on the susceptor 420 and is supported by the susceptor 420.

The plasma generator 440 includes an RF source 442 and a biasing element 444. The RF source 442 is connected to the showerhead 430, and the biasing element 444 is connected to the susceptor 420. An RF signal provided by the RF source 442 can be applied to the showerhead 430, which thus acts as an electrode. The biasing element 444 is associated with the RF source 442 such that the RF power is split between the showerhead 430 and the susceptor 420. A desired voltage and power is applied by the RF source 442 to cause the precursors between the showerhead 430 and the susceptor 420 to discharge and form the plasma 405.

In some embodiments, the plasma treatment may be carried out using an oxygen plasma. Other gases, such as for example argon, nitrogen, nitrous oxide, and helium, may also be used in the plasma treatment process. Process results have shown that a plasma treatment to the wafer 500 being processed reduces the stress in the film deposited thereafter.

The operation S18 of method M includes heating the wafer. In some embodiments, the deposition apparatus 320 further includes a temperature controlling element 460. The temperature controlling element 460 is configured to control a temperature of the susceptor 420 (and thus the wafer 500). In some embodiments, the temperature of the wafer 500 is heated to a predetermined temperature range, which may be from about 360° C. to about 440° C.

The operation S20 of method M includes depositing a sub-layer of an isolation dielectric layer over the bottom electrode. In FIG. 6, the showerhead 430 includes inlet paths 432, 434 and has a plurality of holes 436 connected to the inlet paths 432 or 434, such that the precursors provided by a source container can flow along the inlet path 432 and flow out from the holes 436. In some embodiments, the showerhead 430 sprays single type of the precursors, and the inlet path 432 is connected to all of the holes 436. Therefore, the precursors flow out from all of the holes 436. In some other embodiments, the showerhead 430 sprays multiple types of gases, and the inlet paths 432 and 434 can be formed in the showerhead 430. The inlet paths 432 and 434 are isolated from each other. The inlet path 432 is connected to some of the holes 436, and the inlet path 434 is connected to the remaining holes 436. The precursors can flow along the inlet path 432 and flow out from some of the holes 436, and reaction gases can flow along the inlet path 434 and flow out from the remaining of the holes 436. Therefore, the precursors and the reaction gases are not mixed together and do not react until they enter the deposition chamber 410.

Figure 3E:
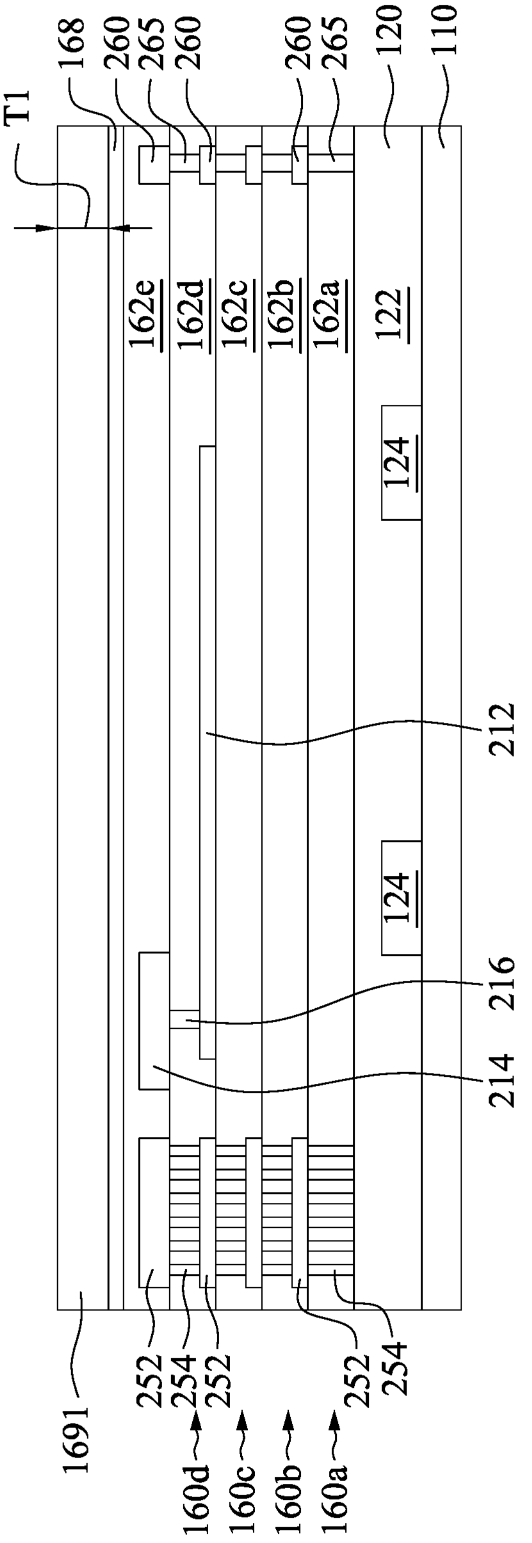

In some embodiments, the precursors are tetraethoxysilane (TEOS), and the reaction gases are oxygen-containing gases (e.g., oxygen ($O_2$)), such that the isolation dielectric layer 169 is a silicon oxide layer. As shown in FIGS. 3E and 6, during the deposition of the sub-layer 1691 of the isolation dielectric layer 169, the precursors and the reaction gases are introduced into the deposition chamber 410 in sequence. The precursors and the reaction gases are then reacted in the deposition chamber 410 and form the sub-layer 1691 over the wafer 500 (or the protection layer 168). In some embodiments, a thickness T1 of the sub-layer 1691 is in a range from about 2 μm to about 2.5 μm.

In some embodiments, the precursors have a flow rate in a range from about 1150 milligram per minute (mgm) to about 1250 mgm. The stress of the sub-layer 1691 of the isolation dielectric layer 169 is near 0 (e.g., about-1 MPa to about 1 MPa) when the flow rate of the precursors is in this range. The stress of the sub-layer 1691 is too tensile if the flow rate of the precursors is greater than about 1250 mgm; the stress of the sub-layer 1691 is too compressive if the flow rate of the precursors is less than about 1150 mgm. With such stress (e.g., about-1 MPa to about 1 MPa), the warpage and bowing issues of the wafer 500 due to the formation of the thick isolation dielectric layer 169 can be improved. For example, the warpage of the wafer 500 can be smaller than about 100 μm, and the bowing of the wafer can be smaller than about 50 um (absolute value). The wafer 500 with slight warpage and/or bowing can be adhered to susceptors or chucks of processing apparatuses more stably. In some embodiments, the reaction gases have a flow rate in a range from about 900 sccm (standard cubic centimeters per minute) to about 1100 sccm.

In some embodiments, the RF power of the plasma generator 440 is in a range from about 950 watts to about 1050 watts. The stress of the sub-layer 1691 of the isolation dielectric layer 169 is near 0 (e.g., about −1 MPa to about 1 MPa) when the RF power is in this range. The stress of the sub-layer 1691 is too compressive if the RF power is greater than about 1050 watts; the stress of the sub-layer 1691 is too tensile if the RF power is less than about 950 watts.

In some embodiments, the pressure of the deposition chamber 410 is in a range from about 7.8 torr to about 9.4 torr. In some embodiments, a distance D1 between the showerhead 430 and the wafer 500 is in a range from about 270 mils to about 330 mils. The stress of the sub-layer 1691 of the isolation dielectric layer 169 is near 0 (e.g., about −1 MPa to about 1 MPa) when the pressure and the distance D1 are in this range.

Further, when the flow rate of the precursors, the RF power, the pressure of the deposition chamber 410, and/or the distance D1 is/are in the corresponding range(s), the deposition rate of the sub-layer 1691 is in a range from about 140 angstroms/seconds to about 160 angstroms/seconds, which is referred to as a high deposition rate. With the high deposition rate, the deposition period of the sub-layer 1691 is reduced. Hence, the period of generating the plasma, which provides more charges in the deposition chamber 410 in a longer time, can be reduced, and fewer charges are accumulated on the surfaces of the wafer 500.

Moreover, when the flow rate of the precursors, the RF power, the pressure of the deposition chamber 410, and/or the distance D1 is/are in the corresponding range(s), the film uniformity of the sub-layer 1691 is improved. With a high film uniformity (e.g., less than about 1.5%), the breakdown voltage of the isolation dielectric layer 169 can be raised.

The operation S22 of method M includes stopping providing precursors. Specifically, when the sub-layer 1691 is deposited to a predetermined thickness (e.g., about 2 um to about 2.5 um), the depositing process is stopped, such that the precursors are not provided into to deposition chamber 410 anymore. However, the reaction gases are provided into the deposition chamber 410 during the operation S22.

Figure 8:
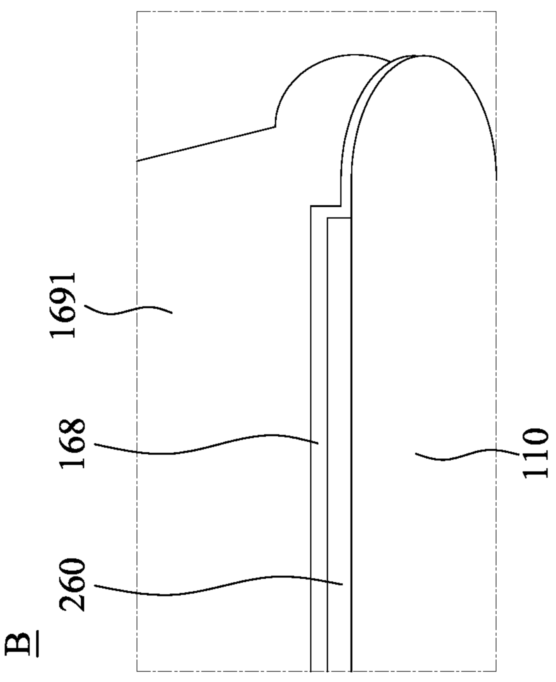
FIG. 8 is an enlarged view of area B in FIG. 7A.
Figure 7A:
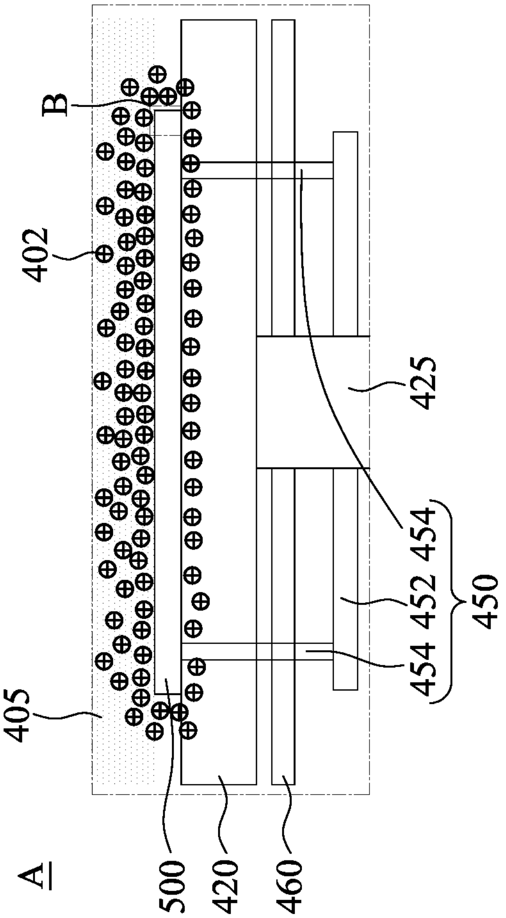
FIG. 7A is an enlarged view in area A of FIG. 6 after the operation S22 in accordance with some embodiments.
Figure 7B:
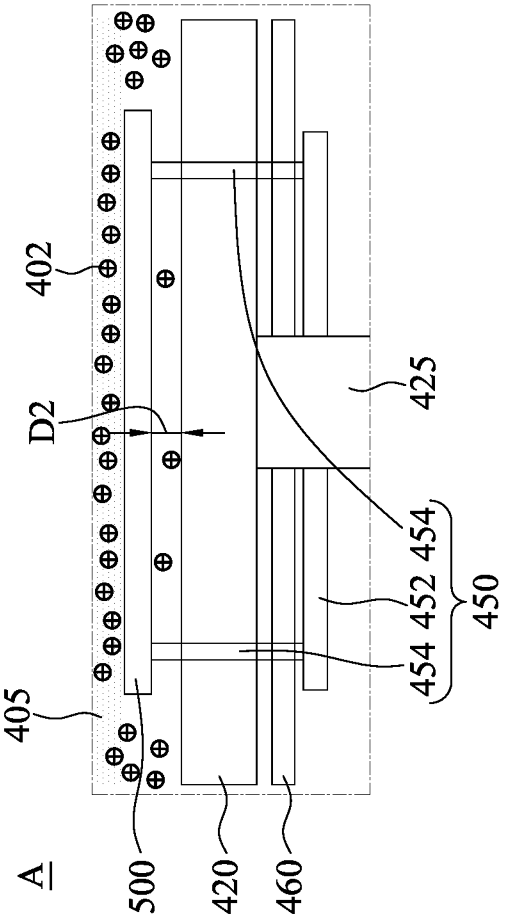
FIG. 7B is an enlarged view in area A of FIG. 6 during the operation S24 in accordance with some embodiments.

The operation S24 of method M includes performing a charge removing process. FIG. 7A is an enlarged view in area A of FIG. 6 after the operation S22 in accordance with some embodiments, FIG. 7B is an enlarged view in area A of FIG. 6 during the operation S24 in accordance with some embodiments, and FIG. 8 is an enlarged view of area B in FIG. 7A. Referring to FIGS. 6 and 7A, after the formation of the sub-layer 1691, charges 402, which are generated by the plasma 405, are accumulated on surfaces of the elements exposed in the deposition chamber 410. That is, the charges 402 may be accumulated on the wafer 500 and especially at the edges thereof. As shown in FIG. 8, the sub-layer 1691 is thinner at the edge of the wafer 500. The thickness difference of the sub-layer 1691 may store stress therein, especially near the bevel of the wafer 500, and the stress may cause peeling of (the thin portion of) the sub-layer 1691. The accumulated charges 402 may be accumulated in the peeling portion of the sub-layer 1691. Therefore, when the wafer 500 is exposed to air, the accumulated charges are quickly released and the peeling portion of the sub-layer 1691 may be delaminated and curved.

However, in the method M, the stress of the sub-layer 1691 is near 0, which is not easy to cause stress difference between the thin portion and thick portion of the sub-layer 1691. Further, a charge removing process can be performed to remove the charges 402 accumulated in the sub-layer 1691. Specifically, during the operation S24 of method M, as shown in FIG. 7B, the wafer 500 is lifted by the lifting mechanism 450 while the reaction gases are continuously provided. The reaction gases form the plasma 405 and flow to the wafer 500. The plasma 405 then removes or neutralizes the charges 402, improving the peeling issue around the edge of the wafer 500. The reaction gases may be oxygen gases. In some other embodiments, the reaction gases may be oxygen-containing gases, inert gases, or combinations thereof during the operation S24.

In some embodiments, the flow rate of the reaction gases during the charge removing process is higher than the flow rate of the reaction gases during the depositing process (e.g., the operation S20) such that the charges 402 can be removed efficiently. Further, the RF power during the charge removing process (e.g., about 80 watts to about 120 watts) is lower than the RF power during the depositing process to prevent more charges 402 generated during the operation S24. In some embodiments, the reaction gases are provided for about 10 seconds to about 15 seconds to prevent more charges 402 generated during the charge removing process. Further, the wafer 500 may be lifted by a distance D2 in a range from about 800 mils to about 900 mils.

The operation S26 of method M includes stopping providing reaction gases and stopping generating plasma. As mentioned above, the charge removing process may provide redundant charges in the deposition chamber 410 if the process proceeds too long. As such, after the charge removing process, the supplement of the reaction gases is stopped, and the plasma generator 440 also stops suppling powers.

The operation S28 of method M includes transporting the wafer to a cooling chamber of the wafer processing system. For example, as shown in FIGS. 4 and 7B, after the charge removing process is finished, the central transfer mechanism 312 enters the deposition chamber 410 and reaches under the wafer 500 to lift the wafer 500 from the pins 454 of the lifting mechanism 450. The central transfer mechanism 312 then transports the wafer 500 (containing the structure illustrated in FIG. 3E) from the deposition apparatus 320 to the cooling chamber 340.

The operation S30 of method M includes cooling down the wafer. As mentioned in the operation S18, the wafer 500 is heated in the deposition chamber 410, such that the wafer 500 is transported to the cooling chamber 340 to be cooled down. The cooling treatment prevents the wafers 500 from sticking on the transport carrier 360 under high temperature. In some embodiments, the temperature of the wafer 500 is cooled down to room temperature or other suitable temperatures. Further, as shown in FIG. 4, the cooling chamber 340 has an environment substantially the same as the polyhedral transfer chamber 310. That is, the cooling chamber 340 is under the vacuum condition. Therefore, the wafer 500 is under the vacuum condition during the operations S16-S30.

Figure 3F:
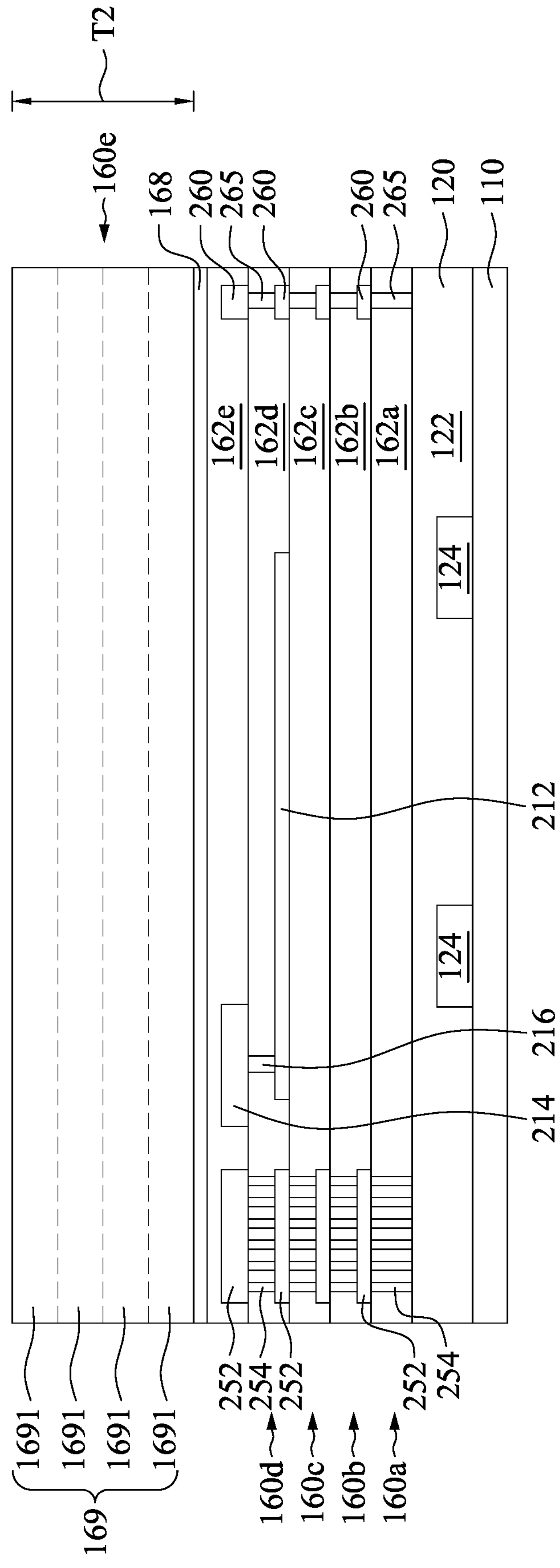

The operation S32 of method M includes determining a thickness of the isolation dielectric layer. In some embodiments, a single layer of the sub-layer 1691 is not thick enough to be the isolation dielectric layer of the capacitor C. As such, multiple layers of the sub-layer 1691 are deposited to form the isolation dielectric layer 169. The wafer 500, which containing the single sub-layer 1691, may further undergo a plurality of deposition processes as described above to form the isolation dielectric layer 169 with the thickness T2 ranges in about 8 um to about 10 um as shown in FIG. 3F. In some embodiments, a wafer 500 containing the sub-layer 1691 having a thickness less than a predetermined value (e.g., about 8 um to about 10 um) goes to the operation S34. In some other embodiments, a wafer 500 containing the sub-layer 1691 having a thickness reaches the predetermined value goes to the operation S36.

The operation S34 of method M includes transporting the wafer from the cooling chamber to the deposition apparatus. Similar to the operation S16, the wafer 500 in the cooling chamber 340 is transported to the deposition apparatuses 320 by using the central transfer mechanism 312.

Subsequently, another sub-layer 1691 is deposited on the first sub-layer 1691 as shown in FIG. 3F. That is, the wafer 500 undergoes the operations S18-S32 again. In some embodiments, four sub-layers 1691 are formed over the protection layer 168 as shown in FIG. 3F, and the four sub-layers 1691 form the isolation dielectric layer 169. The isolation dielectric layer 169, the protection layer 168, the IMD layer 162*e*, the conductive layers 252, the conductive lines 260, and the top conductive layer 214 are together referred to as the fifth metallization layer 160*e*. After the four sub-layers 1691 are deposited, the wafer 500 may undergoes the operation S36 as described below.

The operation S36 of method M includes transporting the wafer from the cooling chamber to the load lock chamber. The wafer 500 in the cooling chamber 340 is transported to at least one of the load lock chambers 330 by using the central transfer mechanism 312. The wafers 500 are transported to the load lock chamber(s) 330 one by one.

As described above, the polyhedral transfer chamber 310, the deposition apparatuses 320, and the cooling chamber 340 are under the vacuum condition. As such, the wafers 500 are not exposed to air until the isolation dielectric layer 169 is completely deposited. That is, the operations S14-S36 are performed under the vacuum condition without vacuum break therebetween. The vacuum condition prevents defects formed on each of the sub-layers 1691, such that there may be no distinct interfaces between the sub-layers 1691. Also, the peeling issue of the isolation dielectric layer 169 can be improved since the interfaces between the sub-layers 1691 almost have no defect.

The operation S38 of method M includes transporting the wafer out of the wafer processing system. After a lot (having the same lot number) of the wafers 500 are collected in the load lock chamber 330, the polyhedral transfer chamber door 331 is closed, and the load lock chamber 330 with the wafers 500 is sealed. The load lock chamber 330 then changes the atmosphere therein, e.g., pumps gases or air into the load lock chamber 330. When the atmosphere of the load lock chamber 330 is compatible with the EFEM 350, the load lock door 332 is open, and the load lock mechanism 352 transports the wafers 500 from the load lock chamber 330 to the transport carrier 360.

Figure 3G:
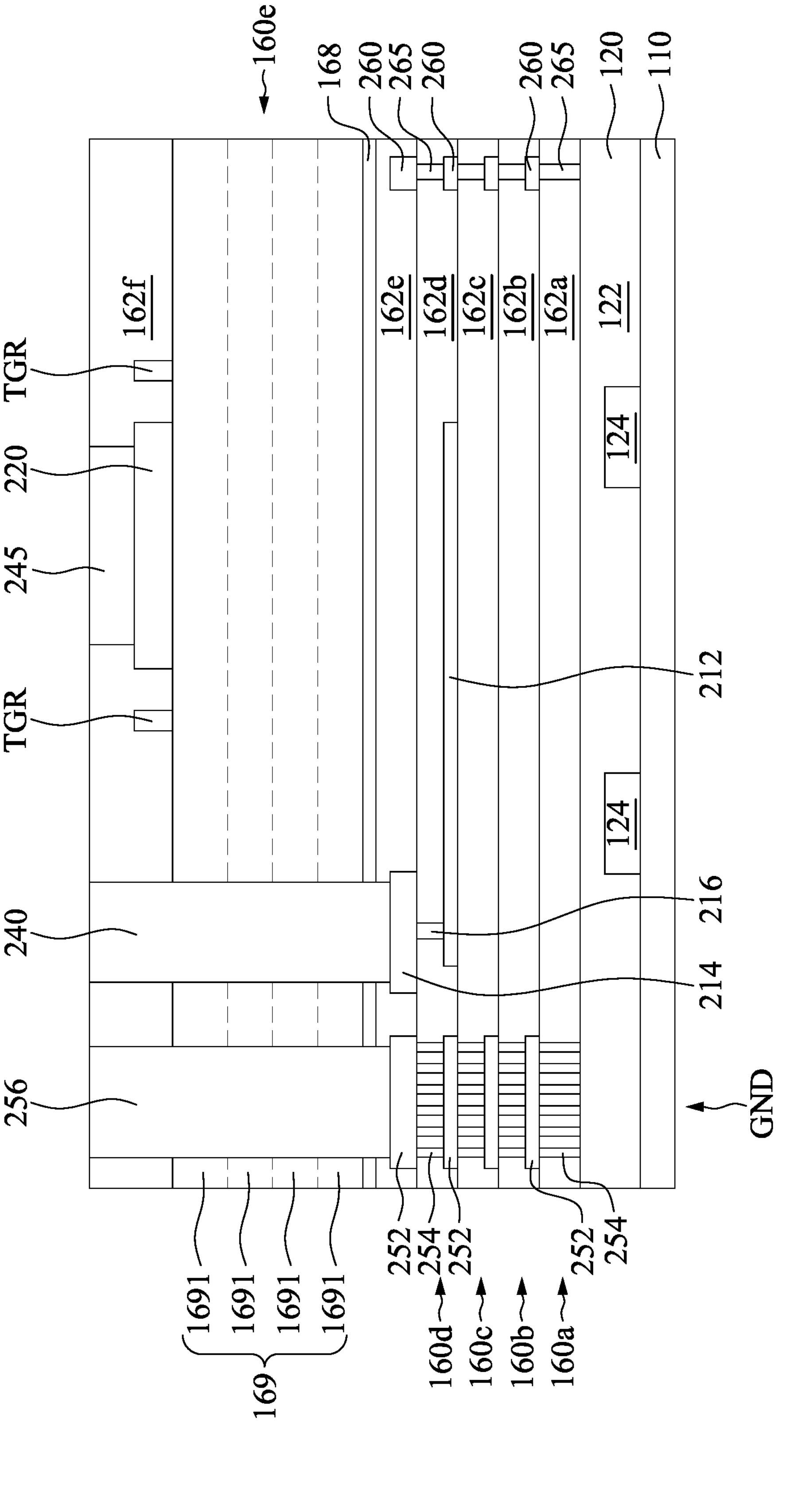

Reference is made to FIG. 3G. After the deposition of the isolation dielectric layer 169, the top electrodes 220 and the top guard rings TGR are formed on the isolation dielectric layer 169. Specifically, a conductive layer is deposited on the isolation dielectric layer 169, and the conductive layer is patterned to form the top electrodes 220 and the top guard rings TGR. Materials, configurations, dimensions, processes and/or operations regarding the top electrodes 220 and the top guard rings TGR are similar to or the same as the conductive layers 252 and the conductive lines 260 in the IMD layer 162*b* described above.

Subsequently, another IMD layer 162*f* is formed over the isolation dielectric layer 169 and covers the top electrodes 220 and the top guard rings TGR. Materials, configurations, dimensions, processes and/or operations regarding the IMD layer 162*f* are similar to or the same as the IMD layer 162*a* described above.

Openings are formed in the IMD layer 162*f*, the isolation dielectric layer 169, the protection layer 168, and the IMD layer 162*e*, such that the top electrodes 220, the top conductive layers 214, and the ground structure GND are exposed by the openings. Conductive material is then filled in the openings, and a planarization process (e.g., chemical and mechanical planarization (CMP) process) is performed to remove excess portions of the conductive materials outside the openings. Hence, the bottom metal pads 240, the top metal pads 245, and the ground pad 256 are formed. In some embodiments, the conductive material is a metal layer and may include aluminum (Al), although it may also be made of copper (Cu), silver (Ag), gold (Au), nickel (Ni), tungsten (W), alloys, or any combination thereof. In some other embodiments, the conductive material may be made of aluminum copper (AlCu). In some embodiments, the conductive material is made by using sputtering, physical vapor deposition (PVD), chemical vapor deposition (CVD), electrochemical copper plating (ECP), and the like. In some embodiments, barrier layers may be deposited in the openings prior to fill the conductive material in the openings. The barrier layers may include one or more layers of a material such as, for example, titanium, titanium nitride, titanium tungsten or combinations thereof.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the isolation dielectric layer has high quality such that the breakdown voltage of the capacitor can be increased. Further, the stress of the isolation dielectric layer is low, and the peeling issue of the isolation dielectric layer can be improved. Moreover, the charge removing process removes the charges accumulated on the isolation dielectric layer, improving the delamination issue of the isolation dielectric layer when the isolation dielectric layer is exposed to air.

According to some embodiments, a method includes forming a bottom electrode of a capacitor over a substrate; depositing an isolation dielectric layer of the capacitor over the bottom electrode; and forming a top electrode of the capacitor over the isolation dielectric layer. Depositing the isolation dielectric layer includes heating the substrate to a predetermined temperature range; depositing a first sub-layer of the isolation dielectric layer at the predetermined temperature range; cooling down the substrate and the first sub-layer; heating the substrate and the first sub-layer to the predetermined temperature range; and depositing a second sub-layer of the isolation dielectric layer on the first sub-layer at the predetermined temperature range, wherein cooling down the substrate and the first sub-layer and heating the substrate and the first sub-layer are performed under a vacuum condition without vacuum break therebetween.

According to some embodiments, a method includes providing a wafer comprising a substrate and a bottom electrode of a capacitor over the substrate; placing the wafer on a susceptor of a deposition apparatus; generating a plasma in the deposition apparatus by using reaction gases; providing precursors into the deposition apparatus to deposit a dielectric layer over the bottom electrode and the substrate; after depositing the dielectric layer, lifting the wafer; after lifting the wafer, reducing an RF power of the deposition apparatus while the reaction gases continuously generate the plasma in the deposition apparatus for a time period; and after the time period, stopping providing the reaction gases and stopping generating the plasma.

According to some embodiments, a method includes forming a device layer over a substrate; and forming an interconnection structure over the device layer and including forming a capacitor in the interconnection structure; forming a bottom metal pad over and electrically connected to the bottom electrode; and forming a top metal pad over and electrically connected to the top electrode. The capacitor includes a bottom electrode; a top electrode over the bottom electrode; and an isolation dielectric layer directly between the bottom electrode and the top electrode. A thickness of the isolation dielectric layer is in a range from about 8 um to about 10 um, and a stress of the isolation dielectric layer is in a range from about −1 MPa to about 1 MPa.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

providing a wafer comprising a substrate and a bottom electrode of a capacitor over the substrate;

placing the wafer on a top surface of a susceptor of a deposition apparatus;

generating a plasma in the deposition apparatus by using reaction gases;

providing precursors into the deposition apparatus to deposit a dielectric layer over the bottom electrode and the substrate;

after depositing the dielectric layer, stopping depositing the dielectric layer, comprising stopping providing the precursors into the deposition apparatus;

after stopping depositing the dielectric layer, lifting the water from the top surface of the susceptor such that the wafer is suspended above the susceptor:

after lifting the wafer, reducing an RF power of the deposition apparatus while the reaction gases continuously generate the plasma in the deposition apparatus for a time period; and after the time period for reducing the RF power of the deposition apparatus, stopping providing the reaction gases and stopping generating the plasma.

2. The method of claim 1, wherein lifting the wafer from the top surface of the susceptor comprises separating the wafer by a distance in a range from 800 mils to 900 mils relative to the top surface of the susceptor.

3. The method of claim 1, wherein the time period for reducing the RF power of the deposition apparatus is in a range from 10 seconds to 15 seconds.

4. The method of claim 1, wherein the reaction gases are oxygen-containing gases, inert gases, or combinations thereof.

5. The method of claim 1, wherein reducing the RF power comprises reducing the RF power to a level in a range from 80 watts to 120 watts.

6. The method of claim 1, further comprising heating the wafer prior to providing the precursors into the deposition apparatus.

7. The method of claim 1, wherein lifting the wafer comprises moving a plurality of pins upward to pass through the susceptor and protrude from the top surface of the susceptor.

8. A method comprising:

placing a wafer comprising a bottom electrode of a capacitor on a susceptor in a deposition chamber of a deposition apparatus;

introducing reaction gases at a first flow rate and precursors into the deposition chamber;

generating a plasma in the deposition chamber at a first RF power to deposit a dielectric layer over the bottom electrode;

stopping depositing the dielectric layer when the dielectric layer reaches a predetermined thickness, comprising stopping introducing the precursors into the deposition chamber;

after stopping depositing the dielectric layer, lifting the wafer vertically from a top surface of the susceptor to a position suspended above the susceptor;

while the wafer is at the position suspended above the susceptor, reducing the first RF power to a second RF power to continuously maintain the plasma for a time period; and after the time period for reducing the first RF power to the second RF power, stopping introducing the reaction gases and stopping generating the plasma.

9. The method of claim 8, wherein lifting the wafer vertically to the position suspended above the susceptor comprises displacing the wafer a distance in a range from 800 mils to 900 mils measured from the top surface of the susceptor.

10. The method of claim 8, wherein the second RF power is in a range from 80 watts to 120 watts, and the time period for reducing the first RF power to the second RF power is in a range from 10 seconds to 15 seconds.

11. The method of claim 8, wherein introducing the reaction gases and the precursors into the deposition chamber comprises supplying the precursors through a first inlet path of a showerhead and supplying the reaction gases through a second inlet path of the showerhead isolated from the first inlet path.

12. The method of claim 8, wherein the predetermined thickness of the dielectric layer is in a range from 2 um to 2.5 um.

13. The method of claim 8, further comprising, after stopping introducing the reaction gases and stopping generating the plasma, transporting the wafer from the deposition chamber to a cooling chamber without breaking a vacuum condition.

14. The method of claim 13, further comprising cooling the wafer in the cooling chamber, and subsequently transporting the wafer back into the deposition chamber to deposit an additional dielectric layer over the dielectric layer without breaking the vacuum condition.

15. A method comprising:

placing a wafer comprising a bottom electrode of a capacitor on a susceptor in a deposition chamber, wherein the susceptor is connected to a biasing element;

introducing reaction gases and precursors into the deposition chamber through a showerhead connected to an RF source;

applying a first RF power from the RF source to generate a plasma between the showerhead and the susceptor to deposit a dielectric layer over the bottom electrode;

stopping depositing the dielectric layer, comprising stopping introducing the precursors into the deposition chamber;

after stopping depositing the dielectric layer, actuating a lifting mechanism to extend a plurality of pins through the susceptor to lift the wafer vertically from a top surface of the susceptor;

while the wafer is supported by the plurality of pins above the susceptor, applying a second RF power from the RF source, the second RF power being lower than the first RF power, while continuously introducing the reaction gases to maintain the plasma for a time period for applying the second RF power from the RF source; and after the time period for applying the second RF power from the RF source, stopping introducing the reaction gases and stopping generating the plasma.

16. The method of claim 15, wherein lifting the wafer vertically from the top surface of the susceptor comprises separating the wafer from the top surface of the susceptor by a distance in a range from 800 mils to 900 mils.

17. The method of claim 15, wherein applying the second RF power comprises reducing the first RF power to a level in a range from 80 watts to 120 watts to prevent additional charges from being generated during the time period.

18. The method of claim 15, wherein the time period for applying the second RF power from the RF source is in a range from 10 seconds to 15 seconds.

19. The method of claim 15, wherein introducing the reaction gases and the precursors into the deposition chamber comprises supplying the precursors through a first inlet path of the showerhead and supplying the reaction gases through a second inlet path of the showerhead such that the precursors and the reaction gases do not mix until entering the deposition chamber.

20. The method of claim 15, wherein depositing the dielectric layer comprises depositing the dielectric layer to a thickness in a range from 2 um to 2.5 um.

* * * * *